(12) United States Patent
Hsu et al.

(10) Patent No.: US 6,693,461 B2
(45) Date of Patent: Feb. 17, 2004

(54) MULTIPLE SUPPLY-VOLTAGE ZIPPER CMOS LOGIC FAMILY WITH LOW ACTIVE LEAKAGE POWER DISSIPATION

(75) Inventors: Steven K. Hsu, Lake Oswego, OR (US); Ram Krishnamurthy, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/027,292

(22) Filed: Dec. 20, 2001

(65) Prior Publication Data

US 2003/0117179 A1 Jun. 26, 2003

(51) Int. Cl.[7] .............................................. H03K 19/096
(52) U.S. Cl. .............................. 326/95; 326/97; 326/98
(58) Field of Search ....................................... 326/93–98

(56) References Cited

U.S. PATENT DOCUMENTS 5,525,916 A * 6/1996 Gu et al. ....................... 326/98
5,973,514 A * 10/1999 Kuo et al. ..................... 326/98
6,002,272 A * 12/1999 Somasekhar et al. ......... 326/98
6,255,853 B1 * 7/2001 Houston ....................... 326/98

* cited by examiner

*Primary Examiner*—Michael Tokar
*Assistant Examiner*—Anh Q Tran
(74) *Attorney, Agent, or Firm*—Seth Z. Kalson

(57) ABSTRACT

An embodiment zipper circuit achieves reduced leakage current by utilizing four voltages so that FETs in the p-logic blocks and n-logic blocks are reversed biased during a pre-charge phase. The FETs in a logic block are also reversed biased during an evaluation phase if the input voltages to the logic block are such that the logic block is not driven ON during the evaluation phase.

21 Claims, 4 Drawing Sheets

MULTIPLE SUPPLY-VOLTAGE ZIPPER CMOS LOGIC FAMILY WITH LOW ACTIVE LEAKAGE POWER DISSIPATION

FIELD

Embodiments of the present invention relate to digital circuits, and more particularly, to dynamic (domino) circuits with reduced leakage current.

BACKGROUND

As integrated circuit process technology allows for smaller and smaller device size, active leakage power dissipation may become a significant component of the total energy dissipated during normal activity. Active leakage power dissipation results when sub-threshold leakage current in a transistor flows across a voltage drop. An example of sub-threshold leakage current is source-to-drain current in a nMOSFET (Metal-Semiconductor-Field-Effect-Transistor) when its gate-to-source voltage is less than its threshold voltage. This active leakage power dissipation not only contributes to unwanted total energy dissipation, but it also affects the performance of dynamic circuits.

A prior art zipper domino circuit is illustrated in FIG. 1. For simplicity, the circuit of FIG. 1 comprises four dynamic stages, where n-logic 102 and n-logic 104 each comprise one or more nMOSFETs connected in various serial and parallel combinations, and p-logic 106 and p-logic 108 each comprise one or more pMOSFETs connected in various serial and parallel combinations, so as to achieve the overall desired logic function for the circuit. For simplicity, only one input port to n-logic 102, denoted as port 110, is shown, but in practice there may be a plurality of such input ports. Also for simplicity, only one input port is shown for each of the other dynamic stages, connected to the output port of the previous dynamic stage, but in practice there may be a plurality of input ports to each of the dynamic stages, perhaps being fed by other circuits, dynamic or static. In FIG. 1, $V_{CC}$ denotes a nominal supply voltage, and $V_{SS}$ denotes a substrate (or ground) voltage.

The clock signal is denoted as $\phi$, and its Boolean (logical) complement by $\bar{\phi}$. Each stage has a pre-charge phase and an evaluation phase, where clock signal $\phi$ is HIGH during an evaluation phase and is LOW during a pre-charge phase. During a pre-charge phase pulldown nMOSFET 112 is OFF and pullup pMOSFET 114 is ON to charge node 116 by providing a low impedance path between node 116 and power rail 118 at supply voltage $V_{CC}$. Also during a pre-charge phase, pullup pMOSFET 120 is OFF and pulldown nMOSFET 122 is ON to discharge node 124 by providing a low impedance path between node 124 and ground (substrate) 126. Similar remarks apply to the other dynamic stages during a pre-charge phase. Note that during a pre-charge phase, node 124 is being discharged rather than charged, so that a p-logic stage may be referred to as having a pre-discharge phase. For simplicity of terminology, it is to be understood that the term "pre-charge" will also refer to "pre-discharge".

During an evaluation phase, clock signal $\phi$ is HIGH so that pMOSFET 114 is OFF and nMOSFET 112 is ON, so that the combination of n-logic 102 and nMOSFET 112 conditionally provide a low impedance path between node 116 and ground (substrate) 126 depending upon the input voltages to n-logic 102. If a low impedance path is so provided, node 116 is discharged. Otherwise, the half-keeper comprising pMOSFET 128 and inverter 130 maintains node 116 in a charged state. Other n-logic dynamic stages operate in similar fashion.

During an evaluation phase, nMOSFET 122 is OFF and pMOSFET 120 is ON, so that the combination of p-logic 106 and pMOSFET 120 conditionally provide a low impedance path between node 124 and power rail 118 depending upon the input voltages to p-logic 106. If a low impedance path is so provided, node 124 is charged. Otherwise, the half-keeper comprising nMOSFET 132 and inverter 134 maintains node 124 in a discharged state. Other p-logic dynamic stages operate in similar fashion.

Note that during a pre-charge phase, nodes in n-logic stages that feed into input ports of p-logic stages are HIGH so that the p-logic stages are OFF. Also note that during a pre-charge phase, nodes in p-logic stages that feed into input ports of n-logic stages are LOW so that n-logic stages not on a clock boundary are OFF. Consequently, the pullup pMOSFETs to p-logic stages and the pulldown nMOSFETs to n-logic stages not on a clock boundary may be removed with connections made directly to power rail 118 or ground 126, as appropriate, provided the other input ports to the p-logic stages are held HIGH and the other input ports to the n-logic stages are held LOW. This is the reason for using dashed lines for various pullup pMOSFETs and pulldown nMOSFETs.

Sub-threshold leakage current in the n-logic and p-logic stages may cause unwanted power dissipation, reduced noise robustness, as well as slower performance. For example, leakage current may cause a node that is suppose to be held HIGH to drop to a low enough voltage so that the circuit does not evaluate properly. One approach to maintaining noise robustness is to upsize the half-keeper circuits so that the various internal nodes are maintained at their proper states. However, this may increase circuit delay because of possible contention between half-keepers and the n-logic or p-logic.

Another approach to mitigating the effects of sub-threshold leakage current is to utilize high threshold voltage devices in the n-logic and p-logic. However, using high threshold voltage devices may decrease circuit performance.

DESCRIPTION OF EMBODIMENTS

Figure 1:
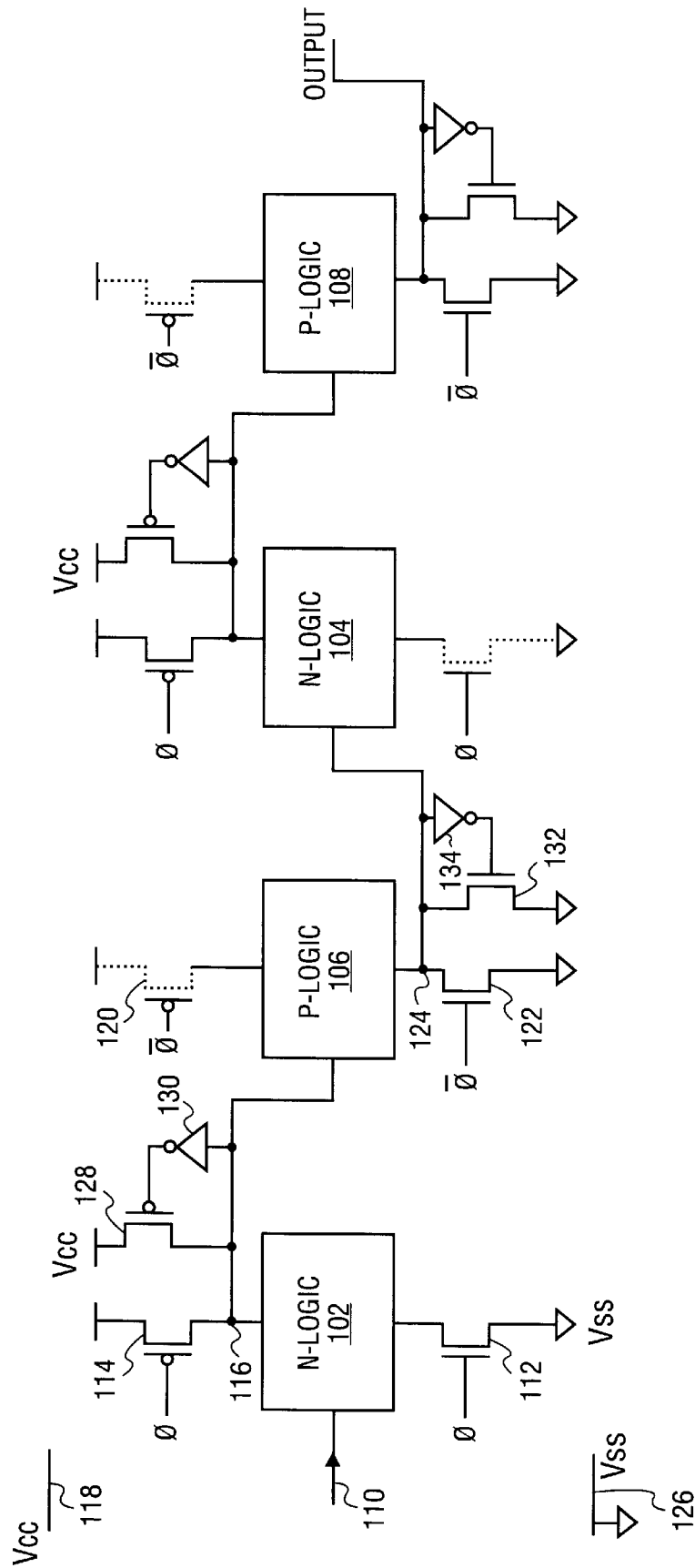
FIG. 1 is a prior art zipper logic circuit.
Figure 2:
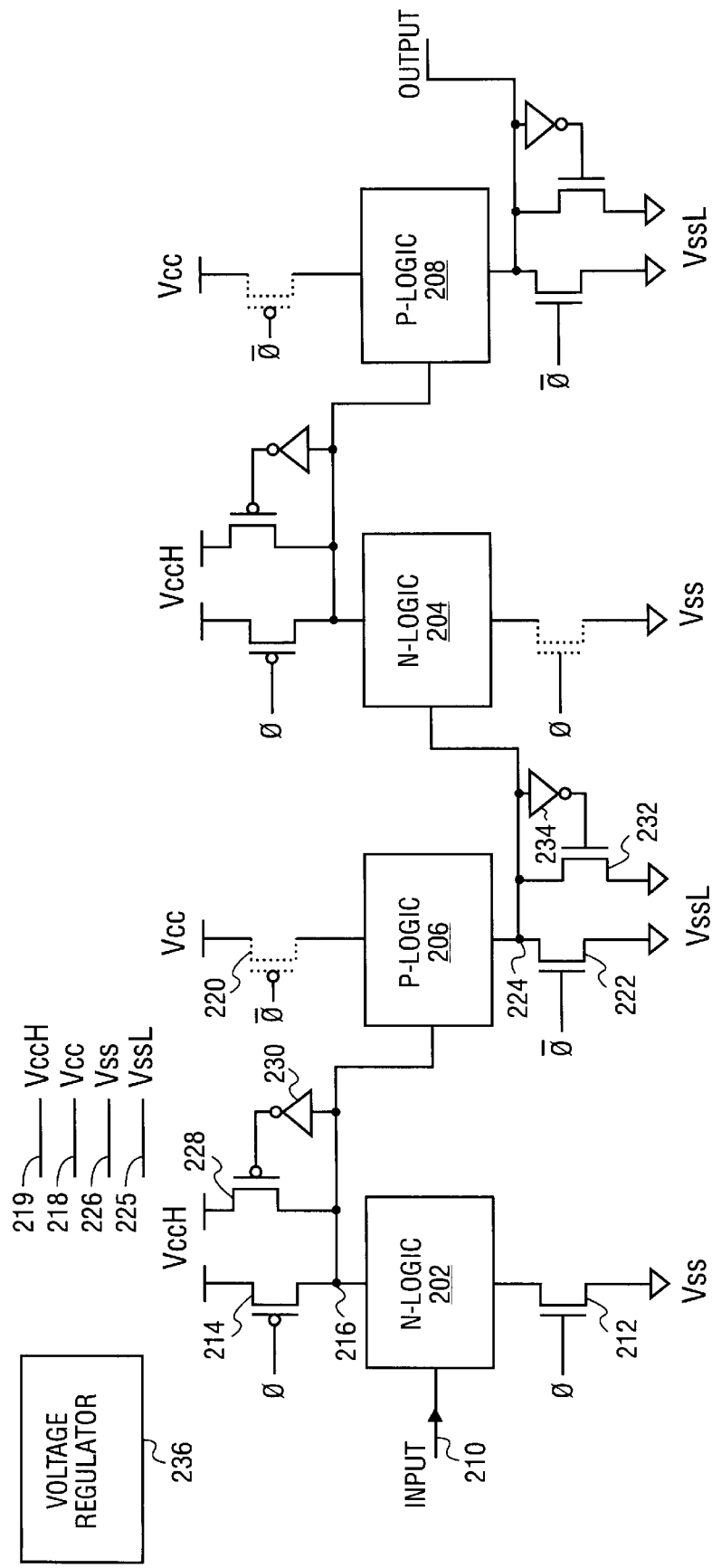
FIG. 2 is a zipper logic circuit according to an embodiment of the present invention.

A multiple supply voltage zipper logic circuit according to an embodiment of the present invention is given in FIG. 2. Again, for simplicity, the circuit of FIG. 2 comprises four dynamic stages, where n-logic 202 and n-logic 204 each comprise one or more nMOSFETs connected in various serial and parallel combinations, and p-logic 206 and p-logic 208 each comprise one or more pMOSFETs connected in various serial and parallel combinations, so as to achieve the overall desired logic function for the circuit. As in FIG. 1, only one input port to n-logic 202, denoted as port 210, is shown, but in practice there may be a plurality of such input ports. As described in connection with FIG. 1, only one input port is shown for each of the other dynamic stages, connected to the output port of the previous dynamic stage, but in practice there may be a plurality of input ports to each of the dynamic stages, perhaps being fed by other circuits, dynamic or static.

In FIG. 2, $V_{CC}$ denotes a nominal supply voltage, $V_{SS}$ denotes a substrate (or ground) voltage, $V_{CCH}$ denotes a voltage larger than the nominal supply voltage $V_{CC}$, and $V_{SSL}$ denotes a voltage less than ground voltage $V_{SS}$. Consequently, four rails, 219, 218, 226, and 225 are indicated having, respectively, voltages $V_{CCH}$, $V_{CC}$, $V_{SS}$, and $V_{SSL}$. These four voltages satisfy the relationship: $V_{CCH} > V_{CC} > V_{SS} > V_{SSL}$. These voltages are supplied (regulated) by voltage regulator 236. Part or all of voltage regulator 236 may reside on the same die as the integrated circuit of FIG. 2, or it may completely reside off the die.

The clock signal is denoted as φ, and its Boolean (logical) complement by $\bar{\phi}$. The clock signal swings from $V_{CCH}$ to $V_{SSL}$. Each stage has a pre-charge phase and an evaluation phase, where clock signal φ is HIGH during an evaluation phase and is LOW during a pre-charge phase. During a pre-charge phase pulldown nMOSFET 212 is OFF and pullup pMOSFET 214 is ON to charge node 216 by providing a low impedance path between node 216 and power rail 219 at voltage $V_{CCH}$. Consequently, node 216 is pulled up to a voltage substantially equal to $V_{CCH}$. Also during a pre-charge phase, pullup pMOSFET 220 is OFF and pulldown nMOSFET 222 is ON to discharge node 224 by providing a low impedance path between node 224 and rail 225. Consequently, node 224 is pulled down to a voltage substantially equal to voltage $V_{SSL}$. Similar remarks apply to the other dynamic stages during a pre-charge phase. That is, during a pre-charge phase, nodes in the n-logic stages are pulled up to $V_{CCH}$ and nodes in the p-logic stages are pulled down to $V_{SSL}$. As described in connected with FIG. 1, during a pre-charge phase, node 224 is being discharged rather than charged, so that a p-logic stage may be referred to as having a pre-discharge phase. Again, it is to be understood that for simplicity of terminology, the phrase "pre-charge" will also mean "pre-discharge."

During an evaluation phase, clock signal φ is HIGH so that pMOSFET 214 is OFF and nMOSFET 212 is ON, so that the combination of n-logic 202 and nMOSFET 212 conditionally provide a low impedance path between node 216 and ground (substrate) 226 depending upon the input voltages to n-logic 202. If a low impedance path is so provided, node 216 is discharged. Otherwise, the half-keeper comprising pMOSFET 228 and inverter 230 maintains node 216 in a charged state at voltage $V_{CCH}$. Other n-logic dynamic stages operate in similar fashion.

During an evaluation phase, nMOSFET 222 is OFF and pMOSFET 220 is ON, so that the combination of p-logic 206 and pMOSFET 220 conditionally provide a low impedance path between node 224 and power rail 218 depending upon the input voltages to p-logic 206. If a low impedance path is so provided, node 224 is charged to $V_{CCH}$. Otherwise, the half-keeper comprising nMOSFET 232 and inverter 234 maintains node 224 in a discharged state at voltage $V_{SSL}$. Other p-logic dynamic stages operate in similar fashion.

Consider node 216 in the first n-logic stage of FIG. 2. During a pre-charge phase, and during an evaluation phase for which n-logic 202 does not conditionally provide a low impedance path, node 216 is at voltage $V_{CCH}$. This voltage is provided to the gates of various pMOSFETs in p-logic 206. Assume that other input ports, if any, to p-logic 206 are also at voltage $V_{CCH}$ during a pre-charge phase or during an evaluation phase in which they are suppose to be at a logical "1" (i.e., "HIGH", which for this part of the circuit is $V_{CCH}$.) Then, because $V_{CC}$ is less than $V_{CCH}$, those pMOSFETs within p-logic 206 having their sources directly coupled to power rail 218 are strongly turned OFF. That is, they are reversed bias, having a positive gate-to-source voltage. Consequently, sub-threshold leakage current in p-logic 206 is substantially reduced.

Consider node 224 in the first p-logic stage of FIG. 2. During a pre-charge phase, and during an evaluation phase for which p-logic 206 does not conditionally provide a low impedance path, node 224 is at voltage $V_{SSL}$. This voltage is provided to the gates of various nMOSFETs in n-logic 204. Assume that other input ports, if any, to n-logic 204 are also at voltage $V_{SSL}$ during a pre-charge phase or during an evaluation phase in which they are suppose to be at a logical "0" (i.e., "LOW", which for this part of the circuit is $V_{SSL}$.) Then, because $V_{SS}$ is greater than $V_{SSL}$, those nMOSFETs within n-logic 204 having their sources directly coupled to ground rail 226 are strongly turned OFF. That is, they are reversed-biased, having a negative gate-to-source voltage. Consequently, sub-threshold leakage current in n-logic 204 is substantially reduced.

Input ports to n-logic stage 202 are held at $V_{SSL}$ during the pre-charge phase and during the evaluation phase if they are a logical "0", so that sub-threshold leakage current is also significantly reduced in the first dynamic stage. Consequently, with pullup pMOSFETs to n-logic stages having their sources at $V_{CCH}$ and with pulldown nMOSFETs to p-logic stages having their sources at $V_{SSL}$, the dynamic circuit embodiment of FIG. 2 has significantly reduced sub-threshold leakage current.

From the previous discussion regarding the circuit of FIG. 2, it is easily seen that the pullup pMOSFETs to the p-logic stages and the pulldown nMOSFETs to the n-logic stages that are not on a clock boundary may be removed, with the appropriate sources in the p-logic stages connected to power rail 218 and the appropriate sources in the n-logic stages connected to ground 226. This is the reason for using dashed lines for these circuit symbols.

In the embodiment of FIG. 2, the substrates of the pullup pMOSFETs and the pMOSFETs used in the half-keepers are connected to their sources, so that they are at voltage $V_{CCH}$ for the embodiment of FIG. 2. The substrates of the nMOSFETs are connected to ground 226, and the substrates of the pMOSFETs in the p-logic stages are connected to $V_{CC}$ rail 218. However, other embodiments may have various substrates at different voltages than those indicated in FIG. 2. For example, for some embodiments, the substrates in the pMOSFETs in the p-logic stages may be connected to $V_{CCH}$ rail 219, which would increase the threshold voltage, thereby reducing leakage current even more. Similar remarks apply to the nMOSFETs.

Figure 3:
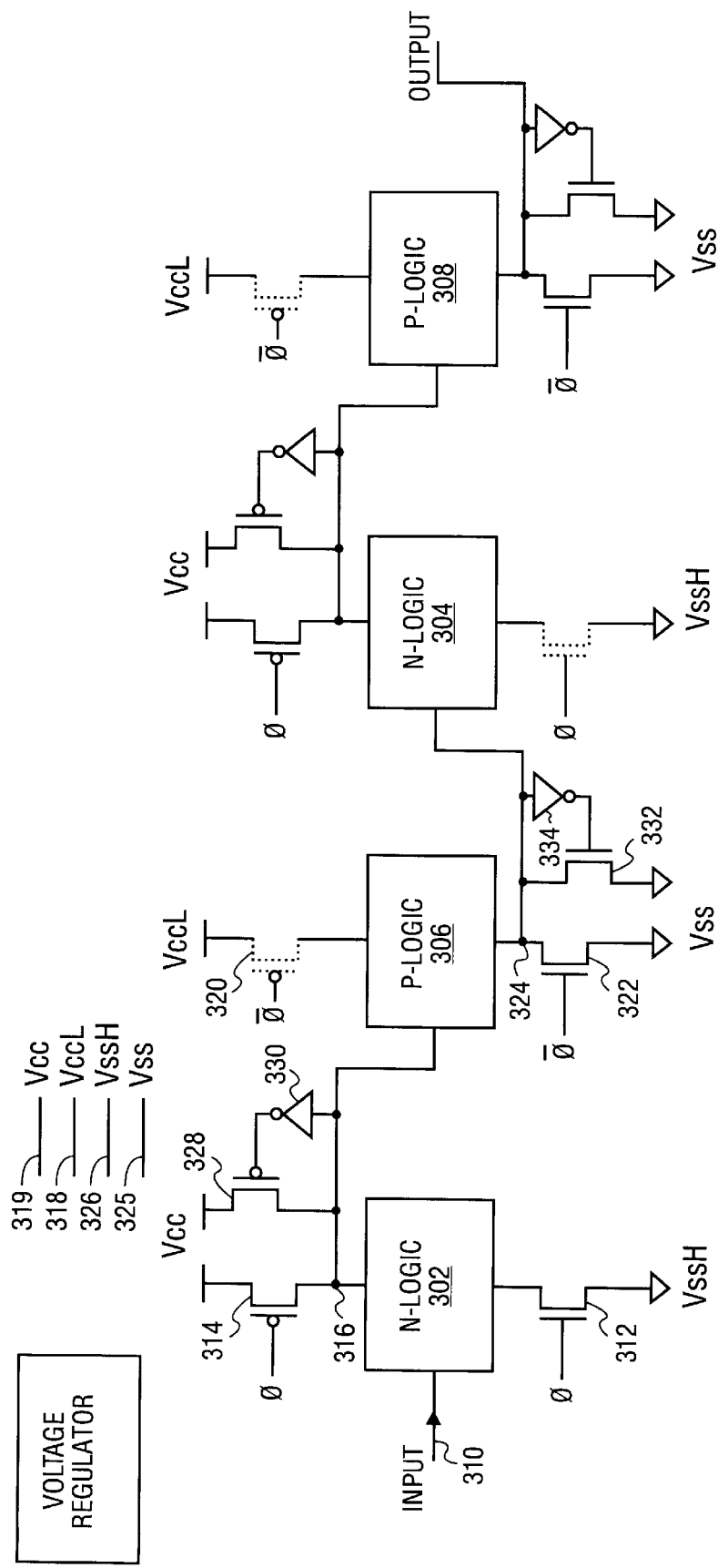
FIG. 3 is a zipper logic circuit according to another embodiment of the present invention.

Another embodiment is given in FIG. 3. The clock signal for the embodiment of FIG. 3 swings from $V_{CC}$ to $V_{SS}$. The voltages at rails 319, 318, 326, and 325, denoted, respectively, by $V_{CC}$, $V_{CCL}$, $V_{SSH}$, and $V_{SS}$, satisfy the relationship: $V_{CC} > V_{CCL} > V_{SSH} > V_{SS}$. As before, $V_{CC}$ is the nominal supply voltage and $V_{SS}$ is the substrate (or ground) voltage. Consequently, all rail voltages in the embodiment of FIG. 3 are within the nominal voltage operating range.

The circuit operation of the embodiment of FIG. 3 may be described in similar fashion to that of embodiment of FIG. 2, where numerals identifying similar devices and functional units between the two embodiments are related in an obvious fashion as observed by inspection of FIGS. 2 and 3. Consequently, it is not necessary to repeat the description of the operation of the embodiment in FIG. 2 for that of FIG. 3. However, the behavior of the two embodiments are not identical. For example, there may be differences between the embodiments of FIGS. 2 and 3 in the biasing of various FETs. For a more specific example, with the body of nMOSFET 222 in FIG. 2 at the substrate voltage $V_{SS}$, nMOSFET 222 is forward body biased. As another example, with the body of pMOSFET 314 in FIG. 3 at the voltage $V_{CCL}$, pMOSFET 314 is forward body biased.

Figure 4:
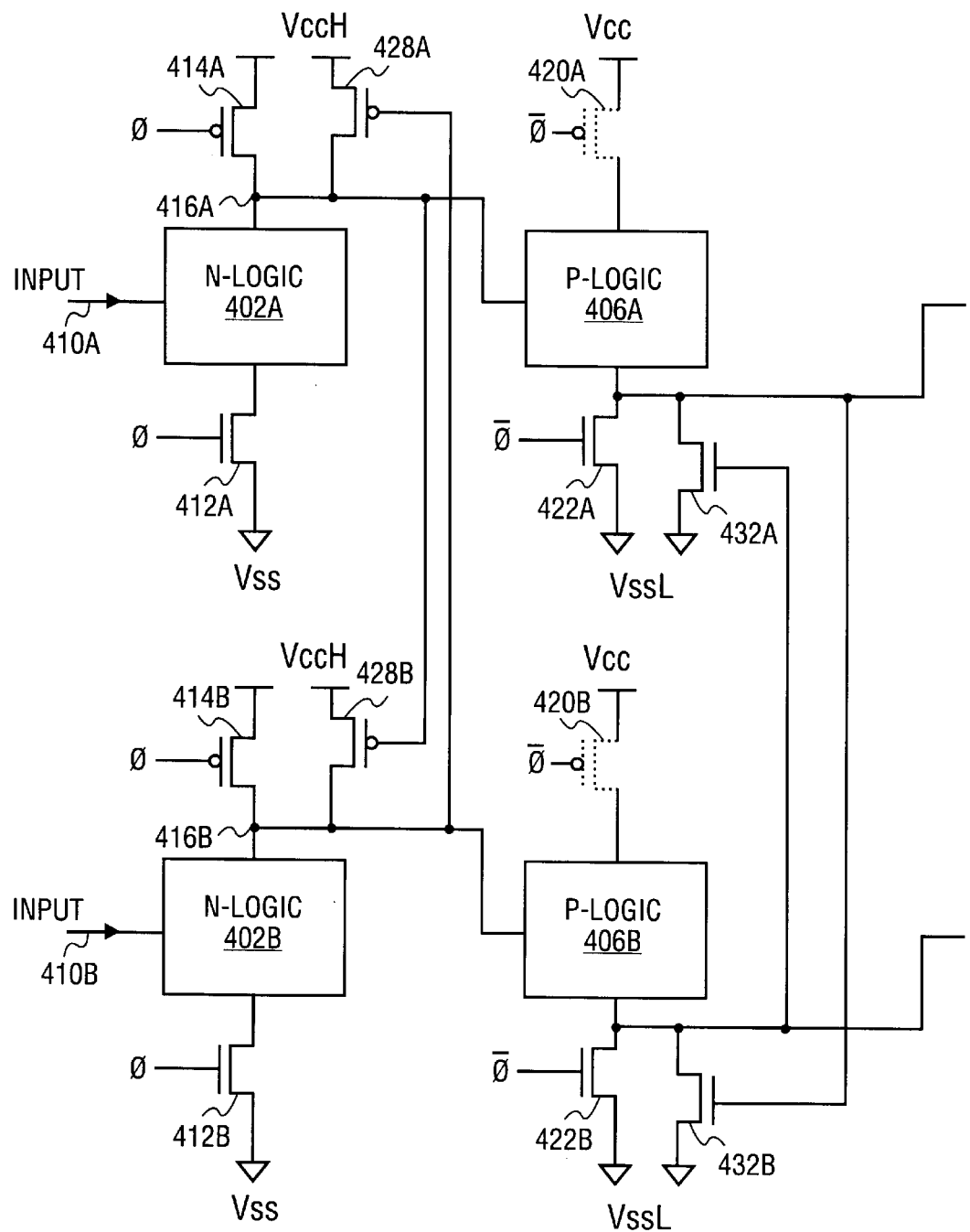
FIG. 4 is a dual rail zipper logic circuit according to an embodiment of the present invention.

A dual-rail embodiment is given in FIG. 4. For simplicity, only two stages of complementary n-logic and p-logic is shown in FIG. 4. The operation of the circuit in FIG. 4 is easily inferred from the description of the circuit in FIG. 2. Logic blocks 402A and 402B are n-logic blocks that are complementary to each other, where the Boolean function performed by one is the Boolean complement of the other. Input ports 410A and 410B receive complementary logic input signals. By using complementary stages, the half-keeper function is provided by coupling the two complementary portions of the first stage as indicated in FIG. 4, where the gate of pMOSFET 428A is connected to node 416B and the gate of pMOSFET 428B is connected to node 416A.

The sources of pMOSFET 414A, 414B, 428A, and 428B are at the voltage $V_{CCH}$, so that the pMOSFETs in the next stage complementary p-logic blocks 406A and 406B are reverse-biased during a pre-charge phase and are reverse-biased during an evaluation stage unless the inputs are such that various gates of the pMOSFETs are supposed to be driven LOW. As described in connected with FIG. 2, this reverse-biasing reduces leakage current. Similar remarks apply to other stages in the embodiment of FIG. 4. For example, the sources of nMOSFETs 422A, 422B, 432A, and 432B are at the voltage $V_{SSL}$ so that the nMOSFETs in the next stage (not shown) are reverse-biased when appropriate.

Another embodiment, a dual-rail version of the embodiment of FIG. 3, may be realized by modifying the embodiment of FIG. 4 so that the sources of pMOSFET 414A, 414B, 428A, and 428B are at the voltage $V_{CC}$, the sources of nMOSFETs 422A, 422B, 432A, and 432B are at the voltage $V_{SS}$, the sources of nMOSFETs 412A and 412B are at the voltage $V_{SSH}$, and the sources of pMOSFETs 420A and 420B are at the voltage $V_{CCL}$.

Various modifications may be made to the disclosed embodiments without departing from the scope of the invention as claimed below.

What is claimed is:

1. A domino circuit having an evaluation phase and a pre-charge phase, the domino circuit comprising:
    a second stage comprising a n-logic block, the n-logic block comprising a nMOSFET having a gate and a source; and
    a first stage to drive the nMOSFET ON and OFF, the first stage comprising a p-logic block and a pulldown to pull the gate of the nMOSFET to a first voltage during the pre-charge phase, wherein the source of the nMOSFET is at a second voltage during the evaluation phase, wherein the second voltage is greater than the first voltage; and
    a third stage comprising a p-logic block, the p-logic block of the third stage comprising a pMOSFET having a gate and a source, wherein the pMOSFET source is at a third voltage during the evaluation phase;
    wherein the second stage further comprises a pullup to pull the gate of the pMOSFET to a fourth voltage during the pre-charge phase, wherein the fourth voltage is greater than the third voltage, and the third voltage is greater than the second voltage.

2. The domino circuit as set forth in claim 1 further comprising a substrate having a substrate voltage, wherein the first voltage is the substrate voltage.

3. The domino circuit as set forth in claim 2, wherein the fourth voltage is a nominal supply voltage.

4. The domino circuit as set forth in claim 1 further comprising a substrate having a substrate voltage, wherein the second voltage is the substrate voltage.

5. The domino circuit as set forth in claim 4, wherein the third voltage is a nominal supply voltage.

6. The domino circuit as set forth in claim 1 further comprising a substrate having a substrate voltage, wherein the first voltage is the substrate voltage.

7. The domino circuit as set forth in claim 1 further comprising a substrate having a substrate voltage, wherein the second voltage is the substrate voltage.

8. A circuit comprising:
    a first rail;
    a second rail;
    a third rail; and
    a fourth rail;
    a domino circuit having a pre-charge phase and an evaluation phase and comprising a second stage, the second stage comprising:
        a node;
        a n-logic block comprising a set of input ports, each input port having a voltage, the n-logic block to conditionally provide a low impedance path between the node and the second rail during the evaluation phase depending upon the set of input port voltages;
        a pullup to provide a low impedance path between the node and the fourth rail during the pre-charge phase;
    the domino circuit further comprising a first stage, the first stage comprising
        a node connected to an input port belonging to the set of input ports; and
        a pulldown to provide a low impedance path between the node of the first stage and the first rail during the pre-charge phase;
    the domino circuit further comprising a third stage, the third stage comprising:
        a p-logic block comprising a p-MOSFET having a gate connected to the node of the second stage and having a source coupled to the third rail so that a low impedance path is provided between the source and the third rail during the evaluation phase.

9. The circuit as set forth in claim 2, further comprising:
    a voltage supply circuit to charge the first, second, third, and fourth rails to, respectively, a first voltage, a second voltage, a third voltage, and a fourth voltage, wherein the fourth voltage is greater than the third voltage, the third voltage is greater than the second voltage, and the second voltage is greater than the first voltage.

10. The circuit as set forth in claim 9, the circuit comprising a substrate having a substrate voltage, wherein the second voltage is equal to the substrate voltage.

11. The circuit as set forth in claim 9, the circuit comprising a substrate having a substrate voltage, wherein the first voltage is equal to the substrate voltage.

12. The circuit as set forth in claim 8, further comprising:
    a voltage supply circuit to charge the first and second rails to, respectively, a first voltage and a second voltage, wherein the second voltage is greater than the first voltage.

13. The circuit as set forth in claim 12, the circuit comprising a substrate having a substrate voltage, wherein the second voltage is equal to the substrate voltage.

14. The circuit as set forth in claim 12, the circuit comprising a substrate having a substrate voltage, wherein the first voltage is equal to the substrate voltage.

15. A method to reduce leakage current in a domino zipper circuit having a pre-charge phase and an evaluation phase, the domino zipper circuit comprising a n-logic block having at least one input voltage and a p-logic block having at least one input voltage, the method comprising:

pulling a first node to a first voltage during the pre-charge phase, wherein the p-logic block conditionally pulls the first node to a third voltage during the evaluation phase depending upon the at least one input voltage to the p-logic block; and pulling a second node to a fourth voltage during the pre-charge phase, wherein the n-logic block conditionally pulls the second node to a second voltage during the evaluation phase depending upon the at least one input voltage to the n-logic block;

wherein the fourth voltage is greater than the third voltage, the third voltage is greater than the second voltage, and the second voltage is greater than the first voltage.

16. The method as set forth in claim 15, the circuit comprising a substrate having a substrate voltage, wherein the second voltage is equal to the substrate voltage.

17. The method as set forth in claim 15, the circuit comprising a substrate having a substrate voltage, wherein the first voltage is equal to the substrate voltage.

18. A domino circuit comprising:

a second stage comprising a p-logic block, the p-logic block comprising a pMOSFET having a gate and a source; and a first stage to drive the pMOSFET ON and OFF;

wherein the first stage drives the pMOSFET into a reverse-biased state when driving the pMOSFET OFF.

19. The domino circuit as set forth in claim 18, wherein the first stage comprises a n-logic block.

20. The domino circuit as set forth in claim 19, the domino circuit having an evaluation phase and a pre-charge phase, the first stage further comprising:

a pullup to pull the gate of the pMOSFET to a first voltage during the pre-charge phase;

wherein the source of the pMOSFET is at a second voltage during the evaluation phase, wherein the first voltage is less than the second voltage.

21. A circuit comprising:

a first rail;

a second rail; and a domino circuit having a pre-charge phase and an evaluation phase and comprising a second stage, the second stage comprising:

a node;

a p-logic block comprising a set of input ports, each input port having a voltage, the p-logic block to conditionally provide a low impedance path between the node and the second rail during the evaluation phase depending upon the set of input port voltages;

the domino circuit further comprising a first stage, the first stage comprising a node connected to an input port belonging to the set of input ports; and a pullup to provide a low impedance path between the node and the first rail during the pre-charge phase.

* * * * *